United States Patent [19]

Nagayama et al.

[11] Patent Number: 5,540,951
[45] Date of Patent: Jul. 30, 1996

[54] METHOD FOR TWO-DIMENSIONAL ASSEMBLY FORMATION OF FINE PARTICLES FROM A LIQUID DISPERSION

[75] Inventors: Kuniaki Nagayama, 2-21-5, Asagaya-kita, Suginami-ku, Tokyo, Japan; Ivan B. Ivanov, Sofia, Bulgaria

[73] Assignees: Research Development Corporation of Japan; Kuniaki Nagayama, both of Tokyo, Japan

[21] Appl. No.: 183,794

[22] Filed: Jan. 21, 1994

Related U.S. Application Data

[63] Continuation of Ser. No. 974,003, Nov. 9, 1992, abandoned.

[30] Foreign Application Priority Data

Nov. 8, 1991 [JP] Japan .................................. 3-293471

[51] Int. Cl.$^6$ ........................................................ B05D 3/00
[52] U.S. Cl. ...................................... 427/372.2; 427/389.7
[58] Field of Search ............................ 427/372.2, 430.1, 427/389.7, 350

[56] References Cited

U.S. PATENT DOCUMENTS

| | | | |
|---|---|---|---|
| 3,485,658 | 12/1969 | Iler . | |
| 4,051,108 | 9/1977 | Helminiak et al. | 428/426 |
| 4,438,156 | 3/1984 | Homola et al. | 427/128 |
| 4,512,862 | 4/1985 | Rigby | 427/127 |
| 4,801,476 | 1/1989 | Dunsmuir et al. | 427/430.1 |
| 4,902,567 | 2/1990 | Eilersen et al. | 428/690 |
| 4,974,373 | 12/1990 | Kawashima et al. | 51/295 |

FOREIGN PATENT DOCUMENTS 55-15034  2/1980  Japan .

OTHER PUBLICATIONS

"Optical Properties of Uniform Particle-Size Latexes" *Journal of the Optical Society of America*, vol. 44, No. 3, pp. 603–609, Aug., 1954.

"Optical Calibration of Some Monodisperse Polystyrene Latexes in Arrays", *Nature*, Dec. 23, 1961, vol. 192, pp. 1148–1151.

"Imaging by Polystyrene Latex Particles":, *Journal of Colloid and Interface science*, vol. 144, No. 2, Jul. 1991, pp. 538–547.

Kralchevsky et al., Protein Array Project, ERATO, JRDC, "Capillary Forces Between Colloidal Particles", pp. 1–72, 1993.

Paunov et al., Journal of Colloid and Interface Science, "Lateral Capillary Forces between Floating Submillimeter Particles", vol. 157, pp. 100–112, 1993.

Yamaki et al., Nagayama Protein Array Project, ERATO, JRDC, "A Thin Liquid Layer on the Surface of Mercury as a Matrix of a Flow-Mediated Two-Dimensional Assembly of Proteins", 1993.

Denkov et al., American Chemical Society, "Mechanism of Formation of Two-Dimensional Crystals from Latex Particles on Substrates", vol. 8, No. 12, 1992.

Dushkin et al., Chemical Physics Letters, vol. 204, Nos. 5,6, "Nucleation and growth of two-dimensional colloidal crystals", pp. 455–460, Mar. 26, 1993.

Nagayama, "Surface", 31, pp. 353–360, 1993.

Yoshino, S, "Superlong range attractive and repulsive interactions between colloid particles," AIP Conf. Proc., 256 (slow Dyn. Conds. Matter), 354–5 (1992).

*Primary Examiner*—Terry J. Owens
*Attorney, Agent, or Firm*—Wenderoth, Lind & Ponack

[57] ABSTRACT

A method of supplying a liquid dispersive medium of fine particles onto the surface of a substrate having a flat surface, forming a liquid thin film and controlling the liquid thickness of the liquid dispersive medium through evaporation, for example, thereby assembling the particles in a two-dimensional manner. By controlling the liquid thickness of the liquid dispersive medium of the particles, it is possible to cause rapid two-dimensional assembly of the particles, and in addition, to control the order of particle size in the assembly. Fixing of the assembly permits the formation of a film structure.

5 Claims, 4 Drawing Sheets

METHOD FOR TWO-DIMENSIONAL ASSEMBLY FORMATION OF FINE PARTICLES FROM A LIQUID DISPERSION

This application is a continuation of now abandoned application Ser. No. 07/974,003, filed of Nov. 9, 1992, now abandoned.

FIELD OF THE INVENTION

The present invention relates to a method for two-dimensional assembly formation of fine particles. More particularly, the present invention relates to a method for two-dimensional assembly formation of fine particles, which is useful for providing new functional materials in various areas such as electronics, biomaterials, ceramics and metal materials, and for assembling the fine particles in a place where the gravity is non-existent, such as in space.

PRIOR ART

Various methods have conventionally been known as prior arts for forming an assembled structure of atoms, molecules or fine particles. The known methods, for example, for two-dimensionally configuring an atomic assembly or molecular assembly on a plate include vacuum deposition, sputtering, electroplating, and LB (Langmuir-Blodgett) film forming. The known methods for the two-dimensionally deployment of fine particles (protein, oxides, metals, latex or polymers) include a method of applying particles emulsion on a flat surface (such as spin coat process), a method of spreading powdered particles on a flat surface (such as atomizing), and a method of precipitating particles from a dispersive medium onto a liquid-vapor interface or a liquid-liquid interface. These methods for configuring the structure of particles are very important for various solid sensors, magnetic recording media, electronic devices, catalysts and other applications.

Rapid formation and control at a high accuracy of the structure of fine particles is not easy. The methods so far tried actually for this purpose have serious defects.

In the above-mentioned methods for configuring the structure of fine particles, for example, particularly by the method of application thereof, it is difficult to control the film thickness, making it impossible to form a perfectly flat two-dimensional film. In the spreading method, while it is easy to control the film thickness, it is inevitable that a film having an irregular thickness is always formed. Furthermore, the precipitation method, which permits the formation of a two-dimensional film with a single layer of particles, cannot avoid the problem of irregularities. The technology of uniformly assembling particles as a single layer of particles has not as yet been established.

SUMMARY OF THE INVENTION

The present invention was made in view of the circumstances as described above and solves the problem in the conventional methods by providing a novel high-accuracy and high-efficiency method for the two-dimensional assembly formation of particles, which permits a uniform arrangement and orderly assembly of particles into a single layer of particles and a rapid assembly of the particles.

More particularly, the present invention provides a method for the assembly formation of particles, as a solution to the above-mentioned problems, which comprises deploying a liquid dispersive medium of particles on the surface of a substrate, forming a liquid thin film and controlling the thickness thereof, by reducing the liquid in the liquid dispersive medium, thereby forming a two-dimensionally assemblying of particles.

DETAILED DESCRIPTION OF THE INVENTION

The formation of nucleus crystal grains and a growth process are considered in the course of forming an assembly of particles in the present invention.

While various factors are conceivable for the nucleation process, it is attributable mainly to the attractive force between particles and the lateral capillary force (lateral immersion force), the presence of which has been clarified by the present inventor.

Now, the lateral capillary force (lateral immersion force) will be described. The lateral capillary force must be discriminated from the capillary force in the vertical direction (in balance with gravity) which has conventionally been known. The vertical capillary force of liquid on particles present on the surface of a substrate is in balance, in a single particle, with the buoyancy and drag from the substrate, and does not produce force in the horizontal direction. The balance of this vertical force produces, however, asymmetry in the proximity to particles, thus causing production of excess force in the horizontal direction.

Figure 1:
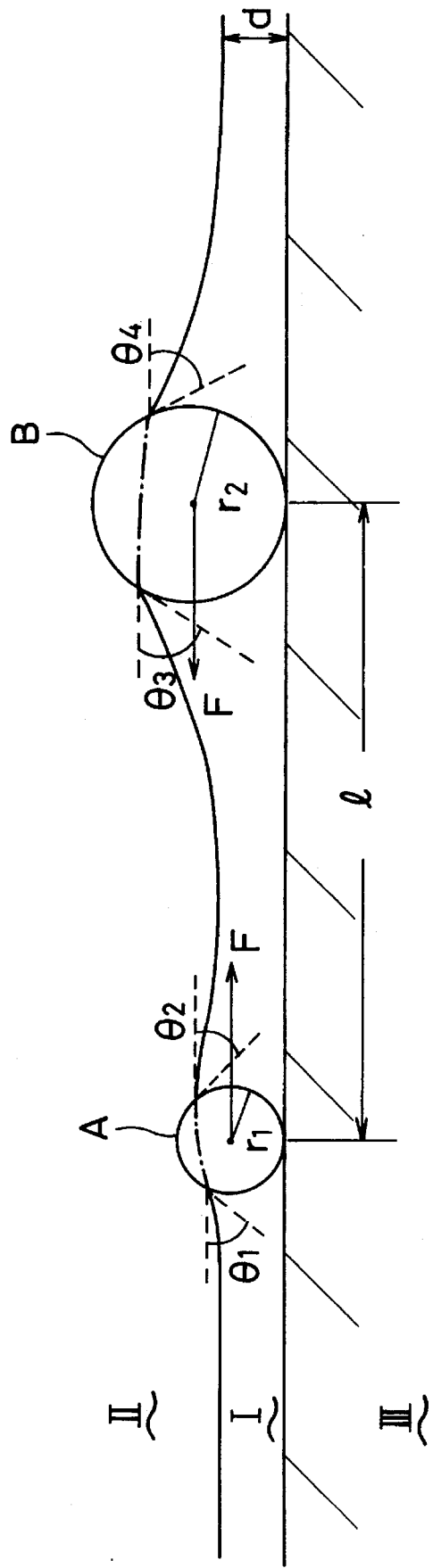
FIG. 1 is a conceptual view illustrating the formation process of crystal nuclei under the effect of lateral capillary force (lateral immersion force) in the method of the present invention.

This is called the lateral capillary force (the lateral immersion force). More specifically, as shown in FIG. 1, by supplying particles (A) and (B) dispersed in a liquid dispersive medium (I) onto a substrate (III) having a flat surface, and controlling the thickness (d) of the liquid dispersive medium (I) to the order of the particle size of the particles (A) and (B), particularly to under the particle size thereof, a considerable attracting force (F) acts on the particles (A) and (B), thus forming a crystal nuclei of the particles (A) and (B). This attracting force (F) may be called the lateral capillary force (lateral immersion force).

The lateral capillary force (lateral immersion force) produced as such an attracting force (F) is theoretically expected to be dependent on the contact angle ($\theta_1$–$\theta_4$) between the particles (A) and (B) and the liquid dispersive medium (I), the thickness (d) of the liquid dispersive medium (I) at a sufficient long distance, the interval distance (l) between the particles (A) and (B), the radius ($r_1$,$r_2$) thereof, the interfacial tension (surface tension when the medium (II) is air) between the liquid dispersive medium (I) and the medium (II), and the difference in density between the liquid dispersive medium (I) and the medium (II). The lateral capillary force (lateral immersion force) is a force acting for a very long distance, and is estimated to be proportional to the reciprocal of the distance (1) between the particles, in the acting area defined by the capillary constant. Because of this feature of being effective for a long distance, the attracting force acts on particles present at a considerable distance.

The attracting force is stronger and assembly formation for nucleation is accelerated according to the ease in which the particles are wetted by the liquid dispersive medium.

The crystal nuclei of the particles are formed on the substrate having a flat surface under the effect of the lateral capillary force (lateral immersion force) as described above.

Figure 2:
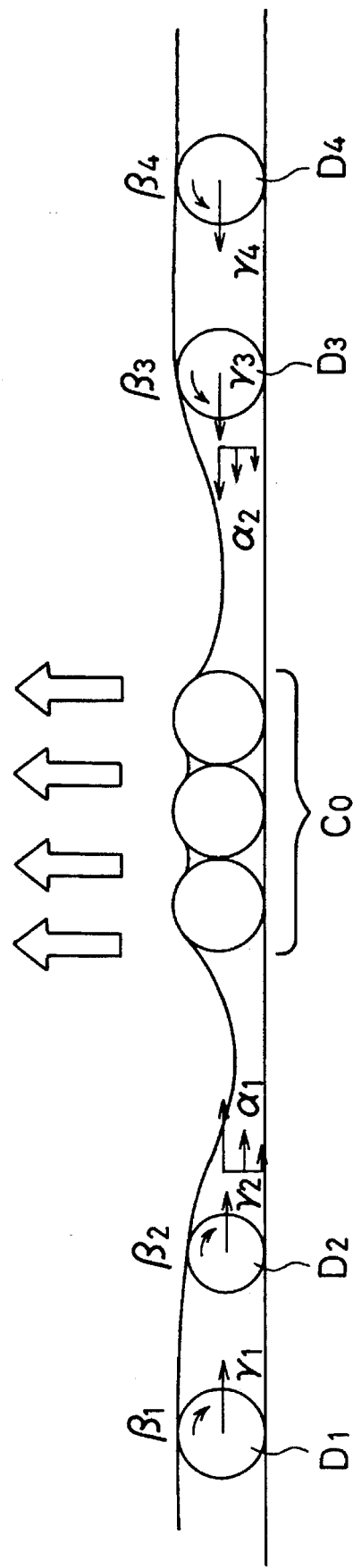
FIG. 2 is a conceptual view illustrating the laminar flow formation in the course of assembling growth in the method of the present invention.

The assembly of the particles in the course of growth depends also upon the laminar flow produced in the liquid dispersive medium (I) along with the changes in the liquid pressure, or the evaporation of liquid dispersive medium (I), as shown in FIG. 2. It is needless to mention that, even in this growing process, the attractive force between the particles and the lateral immersion force continue to act.

The laminar flow will now be described with reference to FIG. 2. When the liquid dispersive medium (I) is evaporated, the amount of evaporation in the area near the crystal nuclei (Co) of the particles produced during the above-mentioned nucleation process increases, if the thickness of the liquid dispersive medium (I) reaches a level below the particle size of the particles. Then, liquid in an amount equal to the decrement of the dispersive liquid flows in. More particularly, liquid flows in under the capillary effect to the crystal nuclei (Co) of the particles, and a laminar flow of liquid is formed in the liquid dispersive medium. The flow velocity distribution ($\alpha_1, \alpha_2$) of this laminar flow indicates the highest velocity near the surface of the liquid dispersive medium, because of little friction force of the liquid with the substrate (III). On the contrary, the flow velocity becomes lower toward the substrate. This produces a velocity gradient in the liquid dispersive medium, whereby the rotational force ($\beta_1-\beta_4$) is generated in the particles ($D_1-D_4$) and thus generated in the particles ($D_1-D_4$). As a result, the particles are subjected to both rotational force $\beta_1-\beta_4$, and translational force $\gamma_1-\gamma_4$, and are assembled toward the crystal nuclei (Co) while rolling on the substrate. These rotational force $\beta_1-\beta_4$ and translational force $\gamma_1-\gamma_4$ act, even when the particles are adsorbed by the substrate, as a force peeling off adsorbed particles, thus making it easy to proceed assembly formation. Even when the scale of assembly becomes sufficiently larger, the process of assembly formation continues so far as the above-mentioned lateral immersion force and laminar flow continue to act around the assembly forming region and so far as the particles are supplied.

Provided however that the laminar flow in the liquid dispersive medium (I) resulting from evaporation has a critical thickness, which is about 1 mm from the surface, the particulates should preferably have a size of up to 1 mm.

There is no particular limitation to the kinds of particles and liquid dispersive medium in the present invention: some typical ones ate shown in Table 1.

When the size of particles is non-uniform, the velocity distribution of the liquid dispersive medium shows a high velocity near the surface, so that the larger particles have a higher velocity than smaller particles. By utilizing this feature, it is possible to form a assembly which forms particles having smaller sizes on the periphery.

The present invention provides an effective means for assembly even in space, where assembly formation based on the gravity effect cannot be expected, since the lateral capillary force (lateral immersion force) and fluid force are valid even in a system of weightlessness.

The assembly of which is controlled by the method of the present invention can be converted into a film structure further excellent in functionality by fixing them as an intrinsic pattern, or by applying a chemical modification or a processing or modification with the use of laser or other light to the particles the assembly. It is also possible to convert the layer of the assembly into a multilayer structure. It is thus possible to apply the method of the present invention for the providing new functional materials in such areas as electronics, biomaterials, ceramics, metals and polymer, including sensors, magnetic thin films, optical thin films and catalytic films, and also to new physical and chemical processing processes and measuring methods.

Now, the present invention will be described further in detail by means of an example.

EXAMPLE 1

Polystyrene latex particles having a maximum particle size of 1.75 µm, a minimum particle size of 1.65 µm, and an average particle size of 1.70 µm were formed through assembly formation on the surface of the glass.

Figure 3A:
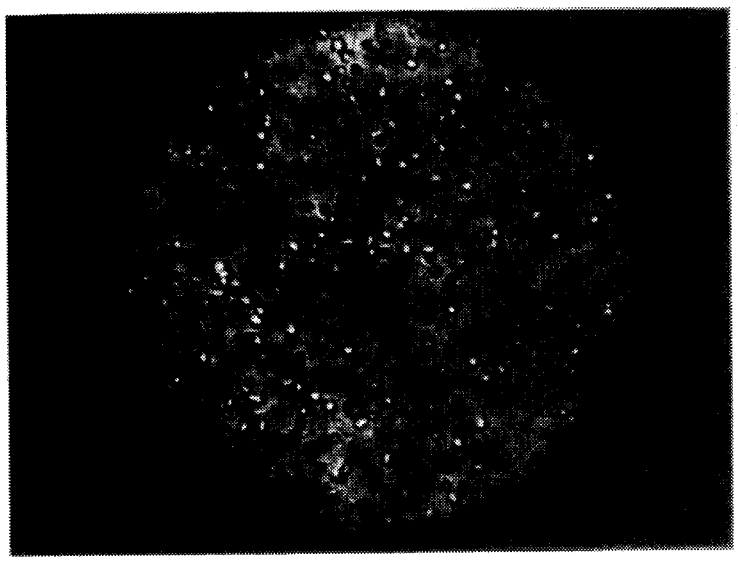
FIG. 3(a) 3(b) and 3(c) are photographic images which illustrate the suspended state and the assembling process on a glass plate, respectively, of latex particles in water.
Figure 3B:
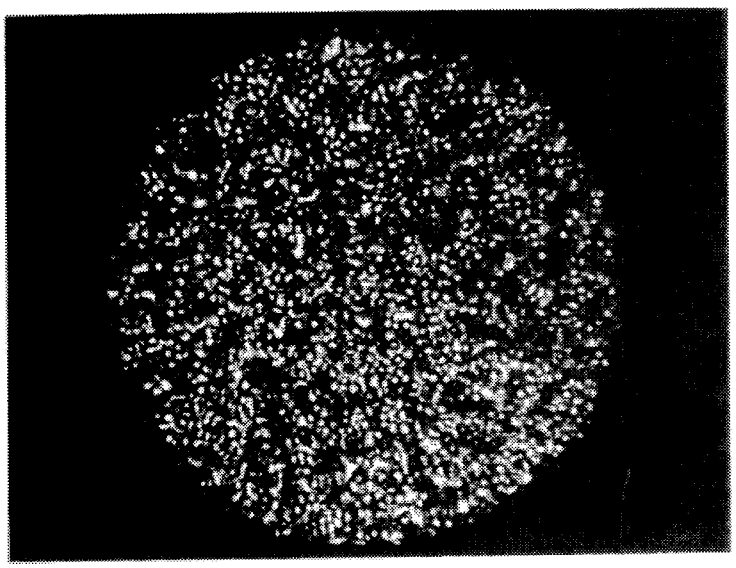
Figure 3C:
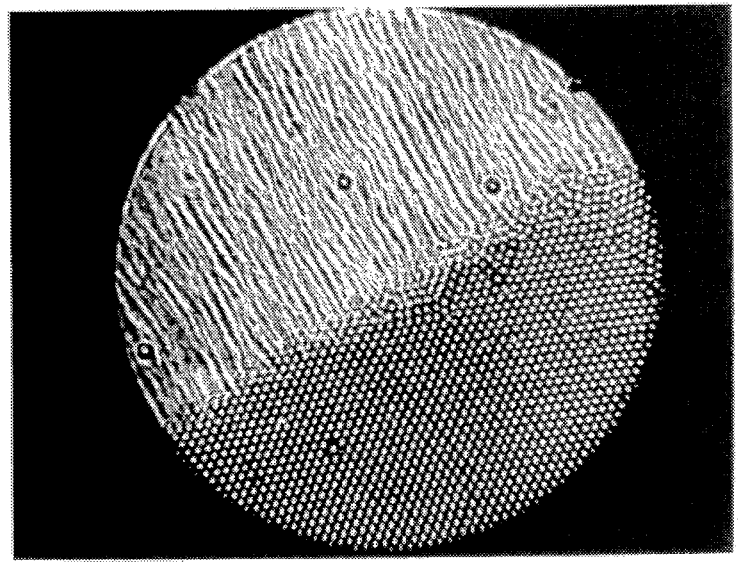

Solution of the above-mentioned polystyrene latex particles in distilled water was deployed on a glass plate to evaporate distilled water. In the state of the liquid thickness of 1.20 µm, the formation of nucleus crystal grains was confirmed, and immediately thereafter, assembly formation of polystyrene latex particles was promptly started, and a two-dimensional single layer of particles of the closest packing was formed. FIG. 3(a) (b) illustrates the state of latex particles suspended in water, and FIG. 3(c), the state in which latex particles are projected above the water surface and in which rapid assembly was started. A uniform layer comprising a particle layer was thus promptly formed.

EXAMPLE 2

Figure 4:
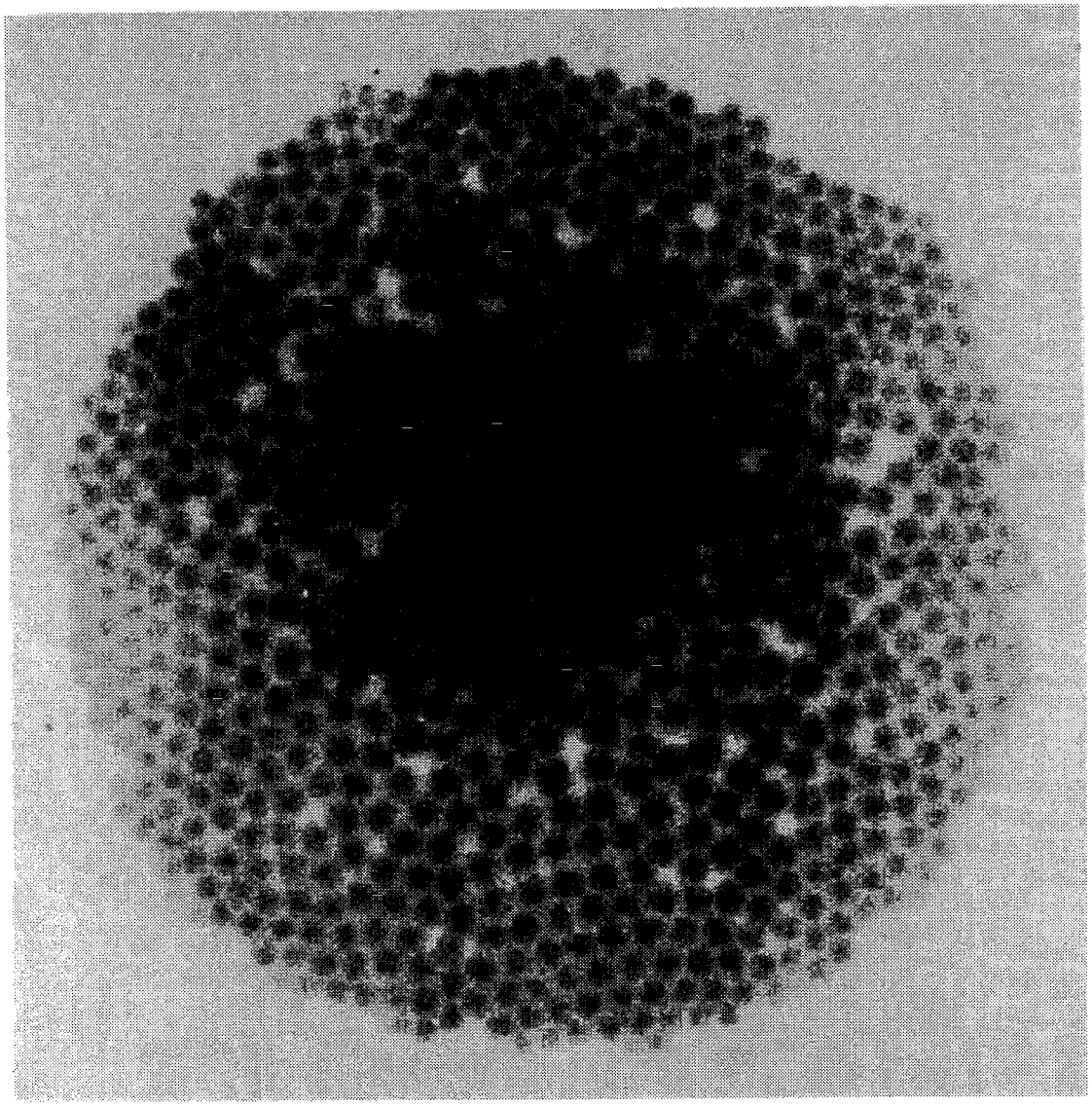
FIG. 4 is a photographic image illustrating the result of two-dimentional assembly of particles on the surface of Hg as a liquid substrate.

FIG. 4 illustrates another two-dimensional single particle layer. Polystyrene latex particles having a maximum particle size of 60 nm, a minimum particle size of 50 nm, and an average particle size of 55 nm were formed through assembly formation on the surface of Hg to form an assembly structure. The periphery is composed of particles having smaller sizes and the whole layer presents a clearly circular alignment.

EXAMPLE 3

The particles provided by the assembly formation above mentioned in Example 1 were fixed on the surface of a glass plate as a substrate, by the complete evaporation of the liquid medium used in the assembly formation. The fixed patterned particles were provided as single layer of the particles.

According to the present invention, as described above in detail, it is possible to rapidly arrange a single particle layer uniformly in order, and cause two-dimensional assembly of particulates, and in addition, to control the particle size in the assembly of particles by controlling the thickness of the liquid dispersive medium containing particles.

TABLE 1

| Particles | Medium (I) | Medium (II) | Substrate (III) |
| --- | --- | --- | --- |
| Polymer or macromolecular ball (latex, protein, etc) | Water, organic solvent | Air | Gas, metal (solid or liquid) |
| Metal ball (gold, iron, alloys, etc.) | Water, oil | Air | Graphite |
| Inorganic substance ball (silica, ceramics, etc.) | Water, organic solvent | Air | Silicon, mica |
| Biological ball (virus, bacteria, cells) | Water | Air | Ceramics |
| Oxide ball (ferrite, etc.) | Organic solvent | Air | Polymer film |
| Bilateral-affinity colloid (micelle, etc.) | Water | Oil | |
| Micro-liquid drops | Water | Oil | — |

What is claimed is:

1. A method for forming a two-dimensional assembly of fine particles, which comprises the steps of deploying a liquid dispersive medium containing a dispersion of fine particles on a substrate, reducing the thickness of the liquid dispersive medium to approximately the diameters of the fine particles in the medium and controlling the thickness of said liquid dispersive medium such as to assemble a two-dimensional array of fine particles on the substrate principally by the combined action of a lateral capillary force among the particles in the liquid dispersive medium and a laminar flow of the liquid dispersive medium.

2. A method according to claim 1 wherein the thickness of the liquid medium is reduced and controlled by evaporation of the liquid in the liquid medium.

3. A method according to claim 1, wherein particles having different particle sizes are employed in the liquid medium and wherein the array of two-dimensional particles are assembled on the substrate in a pattern such that the smaller size particles are assembled at the periphery of the pattern.

4. A method according to claim 1 wherein the thickness of the liquid medium is controlled to a thickness less that the size of the particles in the medium so that the particles protrude above the liquid and by the combination of the laminar flow of the liquid medium coupled with the lateral capillary force among the particles, a two-dimensional, single layer of closely packed particles is formed on the substrate.

5. A method according to claim 4 wherein the thickness of the liquid is reduced by evaporating the liquid medium and controlling the evaporating rate.

* * * * *